United States Patent [19]

Taniguchi et al.

[11] Patent Number: 4,475,223
[45] Date of Patent: Oct. 2, 1984

[54] EXPOSURE PROCESS AND SYSTEM

[75] Inventors: Motoya Taniguchi; Mitsuyoshi Koizumi; Nobuyuki Akiyama; Yukio Kembo; Minoru Ikeda, all of Yokohama, Japan

[73] Assignee: Hitachi, Ltd., Tokyo, Japan

[21] Appl. No.: 387,206

[22] Filed: Jun. 10, 1982

[30] Foreign Application Priority Data

Jun. 12, 1981 [JP] Japan .................................. 56-89545

[51] Int. Cl.$^3$ .............................................. G21K 5/00
[52] U.S. Cl. ..................................... 378/34; 250/492.2
[58] Field of Search ........................ 378/34; 250/492.2

[56] References Cited

U.S. PATENT DOCUMENTS 4,122,335 10/1978 Sullivan ................................ 378/34

Primary Examiner—Craig E. Church
Attorney, Agent, or Firm—Antonelli, Terry & Wands

[57] ABSTRACT

An X ray exposure process and system for transferring a mask pattern onto a wafer with use of X rays, wherein heights on the mask at many points are measured on a light interference band basis by a mask-height measuring device of non-contact measurement type at an X ray exposure position, the mask being mounted on a chamber which is filled with a He gas and or the like to prevent attenuation of an X ray source, heights on the wafer at many points are measured at a wafer-height measuring position different from said exposure position, and according to the measured results, the wafer is finely moved upwardly or downwardly (that is, deformed) individually independently by means of a chuck which sucks and holds the wafer at many points thereon so that, a gap between the mask and wafer is adjusted to a desired level.

11 Claims, 15 Drawing Figures

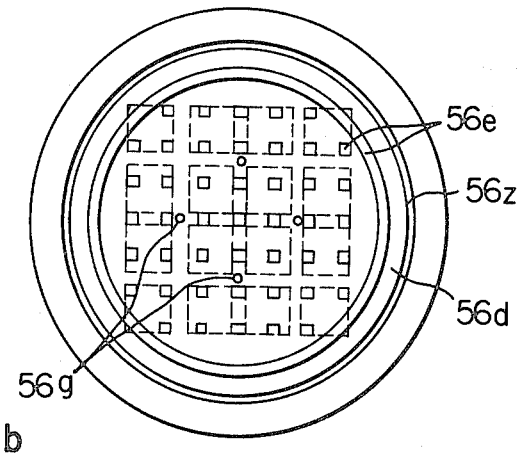
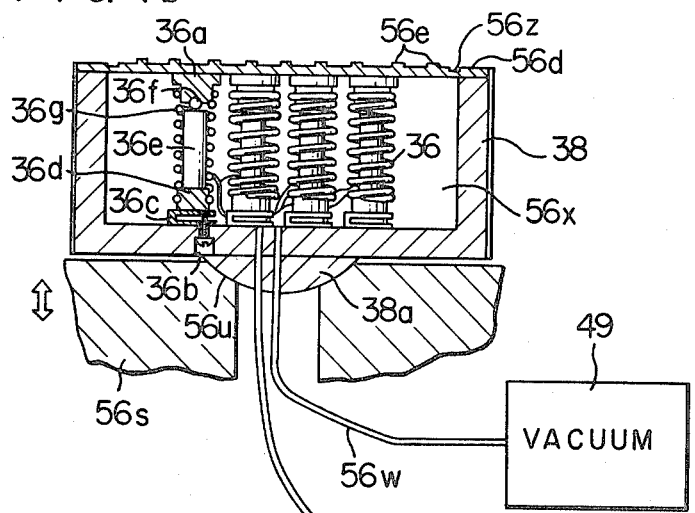
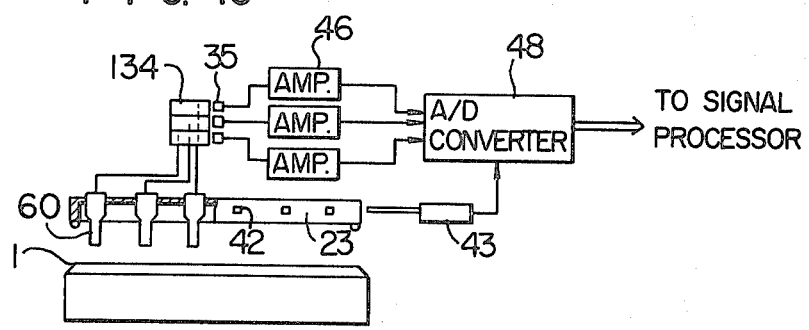

EXPOSURE PROCESS AND SYSTEM

The present invention relates to an X-ray exposure process and system of forming a predetermined pattern provided in a mask on such a substrate as a silicon wafer, bubble wafer, ceramic substrate or printed circuit substrate with use of X rays.

A recent demand for a highly integrated semiconductor circuit requires a finer or more accurate pattern fabrication. In the state of the art, a 1 or 2 micron pattern can be obtained by the photolithographic process, for example, by the ultraviolet ray-exposure process of reflection or reduction projection type. In order to obtain an even more integrated semiconductor circuit, a 1 micron or less pattern, a so-called submicron pattern is necessary. However, it is difficult to obtain a high-resolution projection image by the conventional photolithographic process, because the process involves undesirable problems such as optical diffraction, multi-reflection and interference. Recent research has developed an X-ray exposure process based on soft X rays having wavelengths between about 4 and 14 Å in order to eliminate the above problems.

Explanation will first be directed to the principle of the known X-ray exposure process with reference to FIG. 1.

In operation, when electron beams 4 emitted from an electron gun 3 are accelerated and directed to a target 5 within a vacuum chamber 2 which is kept therein at a high vacuum level (below $10^{-6}$ Torr), characteristic X rays 6 depending upon the material of the target are radiated from the target 5. The X rays 6 are emitted from the chamber 2 through a window 7 mounted thereon. The window 7 can pass or transmit, for example, beryllium(Be) X rays alone. The rays 6 are then projected from the window 7 via a mask 10 onto a resist 12 which is coated on a wafer 11 and reacts with the X rays 6. After exposed to the X rays 6, the resist 12 on the wafer 11 is developed to thereby transfer a pattern 9 onto the wafer 11. The mask 10 comprises a mask carrier or base 8 made of a material (for example, $SiO_2$, $Al_2O_3$ or the like) permeable to X rays, and the pattern 9 carried on the carrier 8 and made of an X-ray absorbing metal such as gold. In this system, the use of soft X rays with short (4 to 14 Å) wavelengths causes less diffraction and scattering due to dust or the like on the wafer 11, allowing a highly accurate transfer of the fine or complicated pattern on the wafer.

Since it is practically difficult to obtain a flux of parallel X rays in the X-ray exposure system, X ray flux radiated from the target 5 is usually used. For this reason, the pattern 9 on the mask 10 is transferred on the wafer 11 in a distance "b"-offset positional relationship. The pattern offset amount "b" is given as $b = S(W/2D)$ where D denotes a distance from the electron beam gun 5, S denotes a gap between the mask 10 and the wafer 11, and W denotes an effective mask diameter (dimension between the outermost ends of the pattern). Further, since the X rays 6 are emitted from the target 5 corresponding to the spot diameter "d" of the electron beams 4, the pattern 9 on the mask 10 is transferred on the wafer 11 with an out-of-focus or defocus amount C. The out-of-focus quantity C is geometrically calculated as $C = S(d/D)$.

In order to transfer a very fine (submicron) pattern on a wafer with use of the X ray exposure system, the out-of-focus amount C must be adjusted below 0.1 microns. On the other hand, the absolute value of the pattern offset "b" does not provide effect directly on the transfer accuracy, but variations in the offset "b" from one lithograph to another must be in the range of $\pm 0.1$ μm.

If the spot diameter "d" of the electron beams 4 is 3 mm, the distance D from the X ray source 5 to the mask 10 is 300 mm, the effective mask diameter W is 75 mm and the permissible out-of-focus amount C of the pattern 9 is 0.1 microns, then the gap S between the mask 10 and the wafer 11 is 10 microns. In order to make $\pm 0.1$ microns variations in the pattern offset "b", variations in the gap S must be in the range of $\pm 0.8$ microns (about $\pm 1$ micron).

The X ray exposure system so far suggested at its experiment and research level, has a difficulty that, as shown in FIG. 2, the gap S between the mask 10 and the wafer 11 is not constant, because the thin and weak mask 10 tends to deform or distort highly, which makes it difficult to transfer the pattern with a high accuracy.

More specifically, in the suggested X ray exposure system, the mask carrier or base 8 is made of material permeable to the X rays 6, for example, macromolecular material such as $SiO_2$, $Al_2O_3$ and polyimide, and is of thin film having a thickness of several microns to several tens microns. Therefore, the mask 10 is weak in strength and tends to deform under varying environmental pressure and temperature. And this tendency of the mask 10 becomes remarkable greater as the mask is made larger, which has, so far, hindered the development of an X ray exposure system on a batch basis.

On the other hand, the wafer 11 has a thickness of about 200 microns and thus is relatively thick and has less deformation and distortion when compared with the mask 10. Further, the wafer 11 has a evenness or flatness of usually above 4 microns and sometimes $\pm 10$ microns. Moreover, it is practically difficult to enhance the flatness of the wafer 10 in the current-level wafer production process.

As has been explained above, the conventional system has a difficulty that the submicron pattern can not be transferred onto the wafer with high accuracy, since the gap S between the wafer 11 and mask 10 varies in the range of $\pm$ several tens microns or above and since the offset "b" and out-of-focus C of the pattern vary each time the wafer is exposed to X rays through the mask 10.

It is an object of the present invention to provide an X-ray exposure process and system which has eliminated the above defects in the prior art, and wherein the wafer is deformed according to the mask shape so as to keep constant the gap or spacing between the wafer and mask and under this condition, the mask pattern is X-ray transferred on the wafer, thereby enhancing the yield in production of a semiconductor, magnetic bubble, thick or thin film circuit or printed circuit substrate.

In order to accomplish the above object, according to the present invention, a pattern exposure station and a wafer-height measuring station are separately provided so as to allow a mask-height measuring device placed on a movable stage to measure heights on the mask surface at many points at the exposure station and also to allow a wafer-height measuring device to measure heights on the wafer surface at many points at the wafer-height measuring station, whereby the wafer is deformed according to the measured results by means of a wafer deforming mechanism so that the gap between the mask and wafer is constant or uniform when the mask is placed on the wafer. The wafer deforming mechanism functions to finely move or displace the wafer upward or downward by means of a chuck which sucks and holds the wafer at its plural points individually and independently.

Next, the mask-height measuring device is moved away from the exposure station and instead the wafer stage including the wafer deformer mechanism is moved toward the exposure station, and then the wafer is exposed to X rays through the mask to thereby transfer a predetermined pattern on the wafer.

The X ray exposure system according to the present invention is characterized in that a chuck comprises a plurality of displacement generating means for independently finely moving the wafer upward or downward at plural positions thereon and means for sucking and holding the wafer on the upper surface of said displacement generating means, and that the wafer is deformed according to the mask shape so as to maintain the spacing between the mask and wafer at a desired value and thereby to transfer the mask pattern on the wafer by exposing the wafer to X rays.

The above and other objects and advantages of the present invention will become clear from the following description with reference to the accompanying drawings, in which:

FIG. 6b is a cross-sectional view of the device of FIG. 6a;

FIG. 7a is a plan view of another embodiment of the wafer deforming device in accordance with the invention;

FIG. 7b is a cross-sectional view of the device of FIG. 7a;

FIG. 10 is a schematic diagram of the signal processing circuit of device of FIG. 8;

Figure 1:
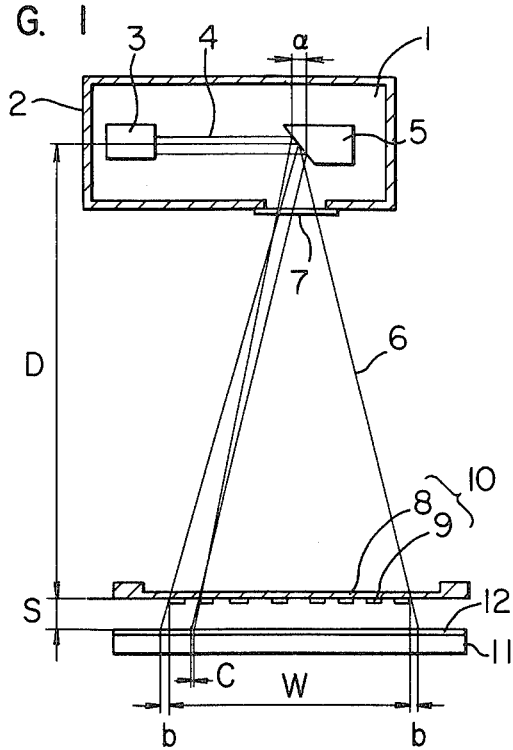
FIG. 1 is a diagram showing the principle of the X ray exposure process.
Figure 2:
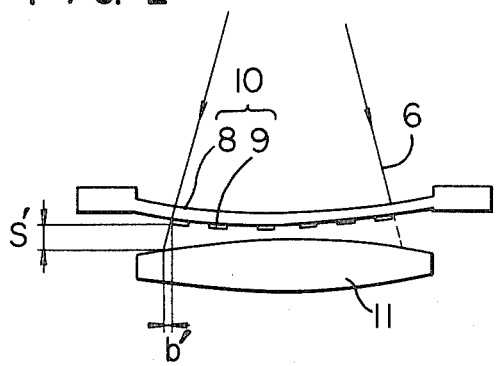
FIG. 2 is a diagram showing a gap relationship between a mask and a wafer used in a prior art system.
Figure 3:
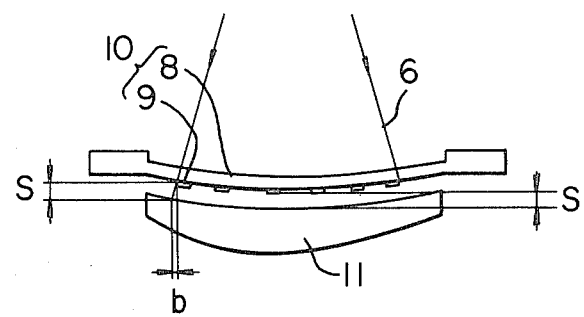
FIG. 3 is a diagram showing a gap relationship between a mask and a wafer used in the present invention.

An X ray exposure process and system according to the present invention will be detailed. The principle of the X ray exposure process is as shown in FIG. 1. As has been explained earlier in connection with the prior-art X ray exposure process, it is difficult, in the prior art, to maintain constant the gap S between the mask 10 and wafer 11 as shown in FIG. 2, since the mask 10 tends to deform or warp and the thickness tolerance of the wafer 11 varies. A major feature of the present invention is to deform the wafer 11 according to the shape of the mask 10 to thereby make constant the gap S between the wafer and mask, as illustrated in FIG. 3.

Figure 4:
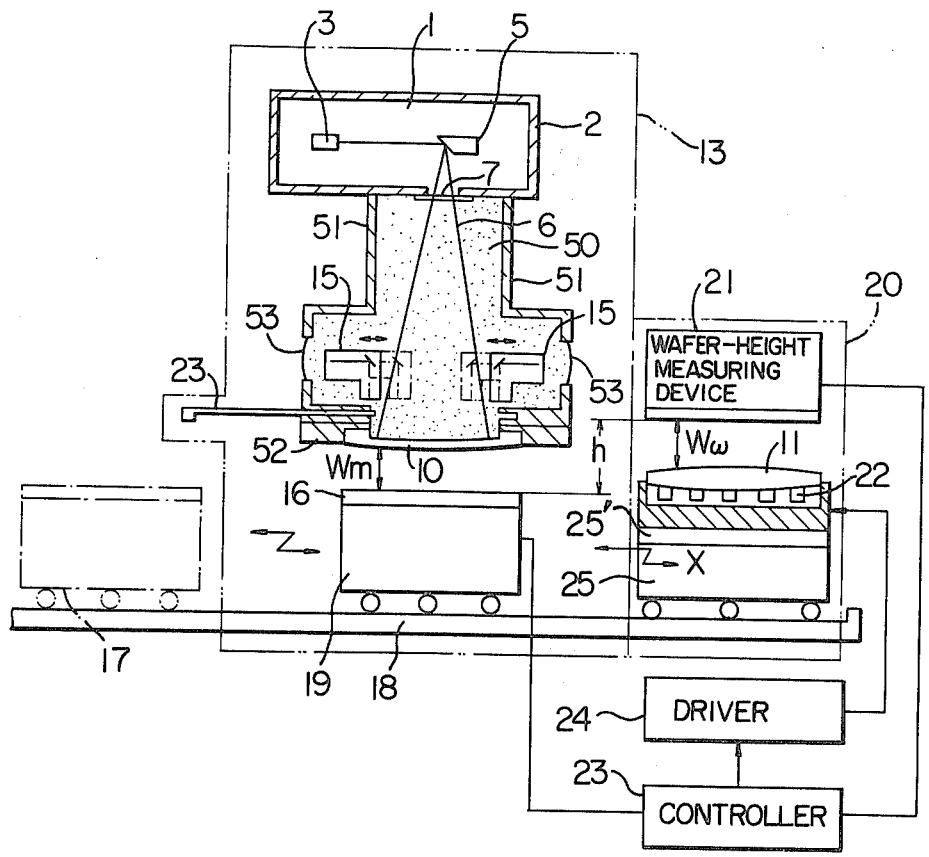
FIGS. 4 and 5 are diagrams showing an X ray exposure process and system in accordance with the invention.
Figure 5:
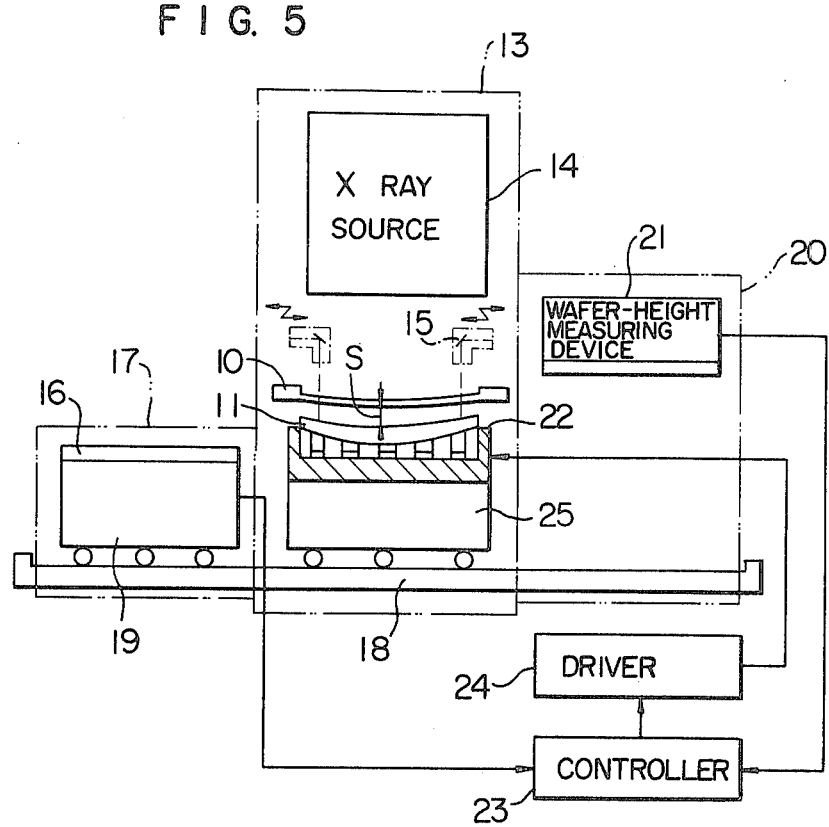

There is shown an embodiment of the X ray exposure process according to the invention in FIGS. 4 and 5 wherein the mask 10 and a position detector or alignment scope 15 (which will be described later) for aligning the wafer 11 with the mask 10 are provided below an X ray source 14 in the X ray exposure station 13.

More specifically, the electron gun 3 and the target 5 are as an X-ray generating source placed within the vacuum chamber 2 which is kept therein at a high vacuum level (below $10^{-6}$ Torr). On the vacuum chamber 2 near the target 5 is mounted the window 7 through which the X rays 6 are emitted from the chamber 2 into another atmosphere (He atmosphere) 50.

In a practical system, generally, the target 5 is of a water-cooled and rotary type in order to obtain strong X rays. Further, the target 5 is often made of metal such as Al, Si or Pd. In this case, the radiated X rays have wavelengths between 8 and 4 Å.

The window 7 must be able to bear or withstand a pressure difference 760 Torr (about 1.0 kg/cm$^2$) between the vacuum chamber 2 and a He chamber 51, and at the same time must be made of material permeable to X rays. The window 7 may be approximately between 2 and 3 cm$^2$ in its area and may be of thin Be film of 25 microns or less in thickness so long as the window is disposed near the target 5, which is enough to withstand the pressure difference between the chambers.

Since such a thin film can be used as the window 5, this can also reduce the attenuation factor of the X ray. The X rays 6 passed through the window 7 are directed to the wafer 11 via the pattern of the mask 10 which is attached directly to the lower end of the He chamber 51. The chamber 51 is filled with a He gas, etc. and kept at an atmospheric pressure (760 Torr). The mask 10 is deformable and has a thickness of several μm. The mask also comprises a carrier or base 8 made of SiO$_2$, Al$_2$O$_3$ and the like permeable to X ray and a circuit pattern 9 made of such X-ray absorbent material as gold. The mask is removably attached to the lower end of the chamber 51 with the mask engaged with a mask holder 52.

In order to allow an X-ray transfer of a lot of wafers 11 with use of a single piece of mask 10 and correspondingly raise its throughput remarkably, the mask 10 must be aligned accurately with the pattern of wafer 11 with the mask mounted on the lower end of the chamber 51. For this purpose, the wafer 11 is fixed on a wafer table 25 in a relation with a very-small-spacing S spaced from the mask 10. When the wafer 11 is spaced by such a small gap from the mask 10, the X ray attenuation is 0.1% and thus can be neglected.

The alignment scope 15 is disposed to allow its horizontal movement and achieve alignment between the mask 10 and wafer 11. Alternatively, since the alignment scope 15 containing therein optical and image elements (linear image sensors) and/or image devices and the like may be sealed, a portion of the scope 15 may be disposed outside of the chamber 51, if necessary. The wafer 11 is comprised of a wafer substrate coated thereon with resist. In order to achieve a proper alignment between the wafer 11 and mask 10, a wafer stage 25' is provided in the wafer table 25 to allow X, Y, Q and Z direction movements for fine or coarse adjustment. Reference numeral 53 is a diaphragm.

On the other hand, a mask-height measuring device 16 is built in the stage 19 to allow movement from the X ray emitting station 13 to a standby position 17, and functions to measure heights Wm of the mask 10 at a plurality of points in the station 13. The stage 19 in turn slidably moves along a straight guide rail 18 accurately. Also, a wafer-height measuring station 20 is provided next to the X ray emitting station 13, and a wafer-height measuring device 21 in the station 20 is used to measure heights Ww of the wafer 11 at a plurality of points. The wafer 11 is sucked and held by a wafer deforming chuck 22. A controller 23 calculates the gaps S between the mask and wafer on the basis of the mask heights Wm and wafer heights Ww measured at the corresponding points thereof, and instructs a wafer height compensation amount ΔWw to a drive controlling section 24 so that the gaps S become constant at the respective points of the mask and wafer. According to the instruction data, the drive controlling section 24 provides corresponding compensation inputs for a plurality of wafer deforming chucks 22 and deforms the wafer 11.

The wafer height compensation ΔWw is given as ΔWw=(S+h)−(Wm+Ww), where "h" is a height difference between the reference surfaces of the mask-height and wafer-height measuring devices and S is a set gap between the mask and wafer. However, it will be understood that the calculation procedure is different depending on the different measuring method and the different setting of the measuring references and thus does not need to always follow the above calculation equation.

The wafer deforming chuck 22 is provided on the wafer feed or movement stage 25 and thus are moved toward the X ray exposure station 13 along the straight guide rail 18. On the other hand, as has been described in the foregoing, the mask-height measuring device 16 is moved toward the standby position 17 by the stage 19 which carries the device 16, after measuring the mask height. FIG. 5 shows the state when the X ray exposure process and system of the invention shown in FIG. 4 is in its X-ray exposure mode.

The wafer movement stage 25 which moves the wafer 11 into the X ray exposure station 13, also contains therein the Y, Q and Z movement mechanism 25' as a wafer-position adjusting mechanism for position alignment between the wafer 11 and the mask pattern. The alignment scope 15 is moved and positioned above the mask 10 before X ray exposure. After being aligned with the wafer movement stage 25 for pattern alignment, the scope 15 is moved up to the standby position to avoid the blockage of X ray passage by the scope and allow the proper exposure of the wafer to X rays.

On the other hand, the wafer 11 can be deformed in the following two manners. That is, the heights of the mask 10 and wafer 11 are measured and according to the measured results, the wafer 11 is deformed at the wafer-height measuring station 20. The measured mask and wafer heights are pre-stored and according to the stored data, the wafer 11 is deformed at the X ray exposure station 13. These two manners can be selected according to the system's controlling requirements.

Next, the wafer deforming procedure and the structure of the wafer deforming chuck 22 will be explained with reference to an embodiment of the present invention.

Figure 6A:
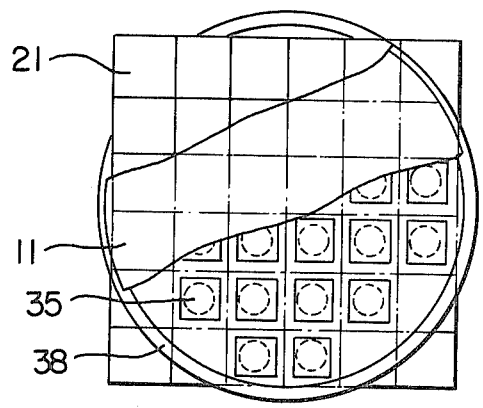
FIG. 6a is a plan view of an embodiment of a wafer deforming device in accordance with the invention.
Figure 6B:
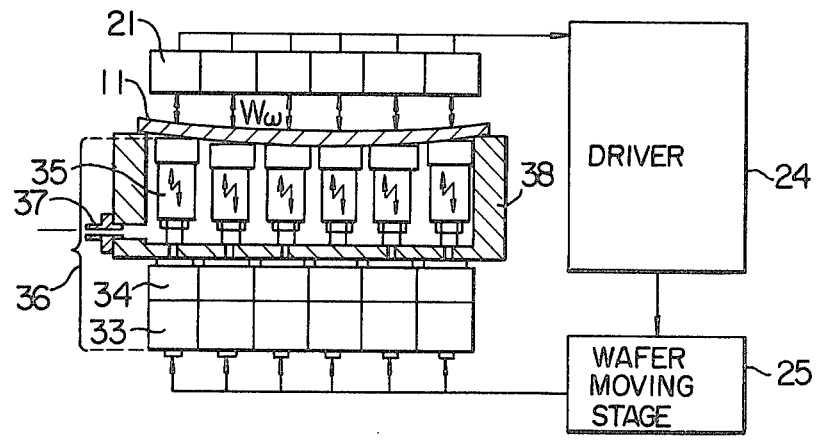

FIGS. 6a and 6b show an embodiment of the wafer deforming chucks wherein the wafer 11 is conformed to the shape of the mask 10 by moving upward or downward up/down elements in the chuck and deforming the wafer. FIGS. 6a and 6b are a plane view and cross-sectional view, respectively, of the detailed structure of the wafer deforming device. For one of the gratings divided as shown in FIG. 6a, an up/down displacement unit 36 is provided which comprises a motor 33, a gear 34, and an up/down element 35 having a feed screw, as shown in FIG. 6b. The wafer deforming chuck device shown in FIGS. 6a and 6b has separately driven up/down displacement units 36, the wafer-height measuring units 21 provided for the respective displacement units 36, a chuck body 38 containing the displacement units 36 for sucking and holding the wafer 11, a piping 37 communicated with a vacuum piping (not shown) for placing the interior of the chuck body under vacuum, the controller 23 used to calculate all the measured wafer-height and mask-height values and determine the up/down amount ΔWw for each of the up/down displacers 36, and the drive controlling section or driver 24 for driving the motors 33.

The wafer 11 is vacuum attracted in such a manner that the wafer follows or conforms to the tip ends of the up/down displacement units 36, and thus the wafer surface can be moved or displaced upwardly or downwardly locally by selectively actuating the respective units 36.

After the measurement of the wafer-height and mask-height, the motors 33 rotate respectively by amounts corresponding to the respective correction ΔWw to thereby move upwardly or downwardly the up/down elements or feed screw 35 via the reduction gears 34 through which the rotational movement of the motor is reduced. In the case where a DC motor is used as the motor 33, the reduction ratio of reduction gear 34 must be as large as 10,000:1 to 100,000:1. On the other hand, when a pulse motor is used as the motor 33, the gear reduction ratio can be small enough to be able to control the up/down element 35 for every approximately 0.5 micron increments or decrements, without any need for such a large gear ratio as in the case of DC motor. Further, the use of the DC motor facilitates an up/down amount control by the detector 21 in a closed loop, whereas the use of the pulse motor allows an open loop control. The DC motor is disadvantageously larger in size and provides more heat even during its stoppage than the pulse motor. In either case of the utilization of the DC and pulse motors, backlash or play must be eliminated or suppressed to a controllable or permissible level.

In short, the wafer deforming chuck 22 has a plurality of up/down elements 35 at its upper side and the elements 35 can be separately displaced upwardly or downwardly by the respective up/down displacement units 36 to allow fine adjustment.

Also, the displacement units 36 may be replaced by not only the above-mentioned screws coupled to the motors but also by piezoelectric elements, mangetostrictive elements, thermally deforming elements, magnet- or fluid-based units, a fine displacement mechanism based on the lever principle, or a combination thereof. In the case of semiconductor wafer, the stroke of the displacement unit 36 must be 30 microns, the positioning accuracy must be below ±1 micron, the deformation rate must be faster than the throughput rate, and the wafer must be stable during its X ray exposure.

As disclosed in FIG. 7 and is shown in U.S. Pat. No. 4,391,511 a thin film 56d may be applied over the displacing devices 36. A structure of the thin film 56d will be described later. The displacing device 36 may comprise a member 36a bonded to the bottom surface of the thin film 56d, a U-shaped member 36c which is clamped to the chuck body 38 and can be level-adjusted by a screw 36d, a member 36d clamped to the member 36c, a piezoelectric element 36e having its lower end fixed to the member 36d, a ball 36f disposed between the upper end of the piezoelectric element 36e and the lower end of the member 36a and a spring 36g for tensioning the member 36a and the member 36d. A sphere 38a is mounted on the bottom surface of the chuck body 38. A stage 56s which supports the sphere 38a of the chuck body 38 by a spherical seat 56u is movable upward and downward by a lead screw mechanism, not shown. Since the substrate 11 is deformed through the thin film 56d while the substrate 11 is sucked and held by the thin film 56d, no localized stress is applied to the substrate 11 and the breaking of the substrate is prevented and the exposure surface of the substrate 11 can be smoothly deformed to conform to a desired shape.

In an alternative of the displacing device 36, vacuum pressures to a plurality of chambers may be adjusted to deform the thin film 56d in the shape of diaphragm. Numeral 56g shows a bore through which the substrate 11 is sucked to the thin film 56d.

The substrate deformation measuring device 21 may be of contact type or non-contact type. The contact type includes a dial gauge device and the non-contact type includes an air micrometer, electromagnetic device, static capacitance device and optical device. The substrate deformation correcting thin film 56d is made of a thin, flexible metal plate such as steel, aluminum, stainless steel, phosphor bronze or silicon, having a thickness of 0.4–3 mm, a thin glass plate having a thickness of approximately 0.7 mm, or a thin resin plate such as Teflon. It has a ring-shaped ribs 56e of approximately 50–100 μm height around an outer periphery thereof and regularly arranged within the outer periphery. A chuck body 38 having a flexible wafer chuck surface 56d integrally fixed to the upper end of a cylinder 56b is mounted inside the rib 56e. The rib 56e may be of square shape or circular shape. In order to support the periphery of the wafer chuck surface 56d substantially freely, a ring-shaped groove 56z is formed to reduce the thickness. In order to eject the exposed wafer 11 by an air jet force, an obliquely oriented transport hole 56g is formed. The hole 56g is connected to a room 56x formed in the chuck body 38. The path 56x is connected to a vacuum source 49 through a flexible pipe 56w.

The wafer-height and mask-height measuring devices are each classified into contact type and non-contact type. A typical example of the contact type measuring devices is a dial gauge, but it is not suitable for mask-height measurement applications because the mask 10 is thin and tends to easily deform. On the other hand, the non-contact type measuring devices include, for example, an air micrometer, an electromagnetic instrument, an electrostatic capacity type instrument, an optical instrument, an ultrasonic-wave based instrument.

Figure 8:
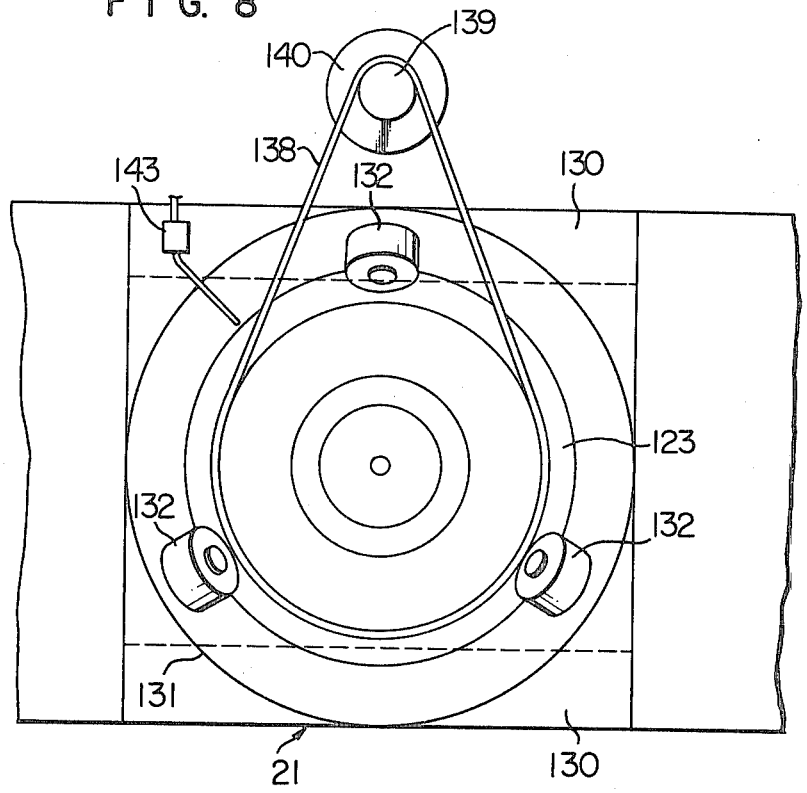
FIG. 8 is a plan view of an embodiment of a wafer-height measuring device in accordance with the invention.
Figure 9:
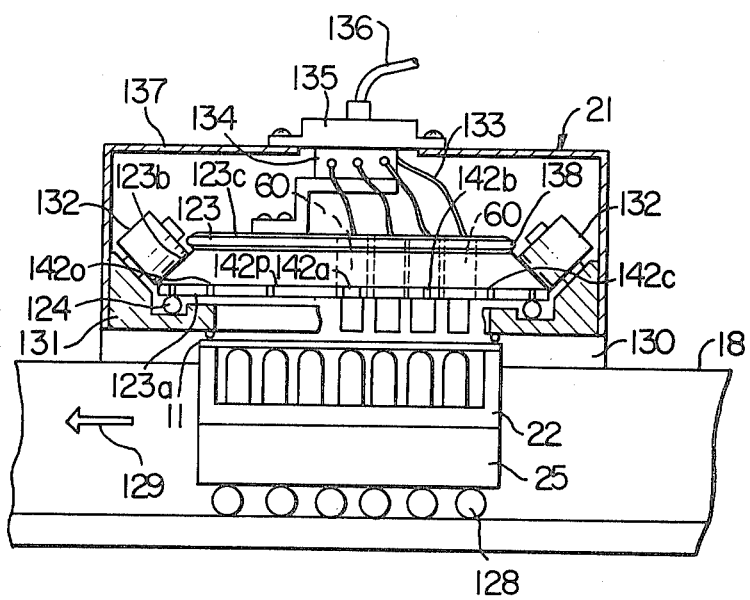
FIG. 9 is a front view of the device of FIG. 8.

An example most preferable as the wafer-height measuring device 21 is disclosed in U.S. patent Ser. No. 292,933 (filed in Aug. 14, 1981) herein as FIGS. 8 to 10. The example will be explained below with reference to FIGS. 8 to 10. Referring now to FIG. 9, the wafer deforming chuck 22 mounted on the wafer feed stage 25 is supported slidably in an arrowed direction 129 by air bearings 128 rested on the straight guide rail 18. The deformation amount of the wafer 11 surface is detected and stored at the wafer-height measuring station 20.

As illustrated in FIG. 9, a disc 123 is disposed in parallel with the wafer 11. The disc 123 is carried on the straight guide rail 18 through air bearing 128. The upper surface of the straight guide rail 18 and the lower surface 123a of the disc 123, contacting with the steel balls 124, are carefully and precisely flattened. The base 131, circular in shape, is fixed on. Accordingly, the disc 123 continues its rotation in a fixed direction, being precisely kept parallel to the wafer 11, by means of the combination of the base 131, the steel balls 124 and the rotating bearings 132.

The disc 123 is provided with a plurality of detecting probes 60 directed at their tips toward the surface of the wafer 11 for detecting distances from the tips thereof to the surface of the wafer 11.

The plurality of detecting probes 60 mounted to the disc 123 are arranged in a linear or curved fashion from the center of the disc 123 to the peripheral portion thereof.

The detecting signals from the detecting probes 60 are led out through cables 133. The cables 133 are fixed to a rotating side 134 of a slip ring which is held by the disc 123 and moves together with the disc 123. The detecting signals further travel from a stationary side 135 of the slip ring which is held by a holder frame 137 fixed to the spacers 130, through a cable 136, to a signal processing means containing a display, an arithmetic unit, a CRT and the like. The signal from the cable 136 is an analog signal produced through one revolution of the disc 123. For the signal processing, the analog signal may directly be used for representing the flatness information of the wafer 11. Alternately, the analog signal may be converted, every given rotational angle of the disc 123, into a digital signal which is used as the flatness information of the wafer 11. In any case of using a digital or analog signal, it is desirable to provide means for detecting rotation position of the disc 123. The disc 123 in FIG. 9 is additionally provided with means for detecting timings to perform the A/D conversion, that is to say, for finding measuring locations on the wafer 11, i.e. rotation positoin of the disc 123. To be more specific, a plurality of marks 142a, 142b, . . . are placed around the lower portion of the shoulder 123b of the disc 123, being arranged equidistantly. When the A/D conversion is performed every 1/16 revolution of the disc 123, sixteen marks 142a, 142b, . . . 142p are placed to the lower shoulder portion every rotation of 22.5°. In this case, the passage of the mark is sensed by a photosensor 143 shown in FIG. 8 and an output signal from the photosensor is used as a timing signal for the A/D conversion or the measuring position data for the wafer 11. If one of the sixteen marks is longer than the remaining ones, a signal representing a rotation start or an origin of the timing signal can be obtained from the longer mark.

A circuit diagram for processing output signals from the detecting probes 60 in synchronism with timing signal obtained by the photosensor 143 to obtain the degree of flatness of the wafer 11 will be explained referring to FIG. 10. FIG. 10 shows an example in which three electrostatic capacitor type sensors are used as the detecting probes 60. In FIG. 10, reference numeral 46 shows current-voltage converting amplifiers each for converting output current from the corresponding detecting probe 60 into a current signal, and 148 shows an analog-digital converter for converting analog voltage signals from the amplifiers 46 into digital signals in response to a timing signal from the photosensor 143. The digital output signal of the A/D converter 148 is applied to a signal processor including a CPU (not shown) for calculating the degree of flatness of the wafer 11.

In this way, the deformation amounts on the wafer 11 surface at many points are detected at the wafer-height measuring station 20. The detecting probe 60 may be such an electrostatic capacity sensor as disclosed in U.S. patent application Ser. No. 6,424,012. The deformation amounts on the wafer 11 surface can be detected by the sensor because the wafer 11 is grounded.

Figure 11:
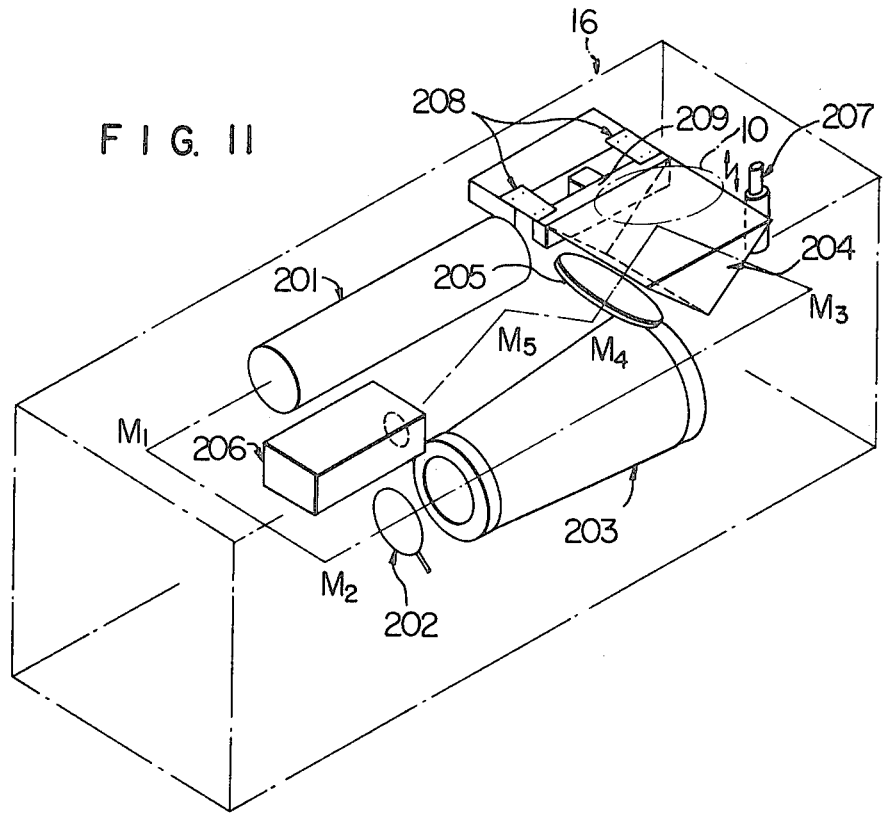
FIG. 11 is a perspective view of an embodiment of a mask-height measuring device in accordance with the invention.

Detailed explanation will next be directed to how the mask-height measuring device 16 detects the deformation amounts on the easy-to-deform mask 10. FIG. 11 shows an arrangement or structure of the mask-height measuring device 16. In the figure, He-Ne laser rays emitted from a laser tube 201 are guided via reflection mirrors $M_1$ and $M_2$ to a deflection plate 202 the rotation of which acts to change the intensity of the received laser rays. The laser rays intensity-adjusted at the deflection plate 202 are then entered in a beam expander 203 to form a laser beam having a spot diameter or size of 30 mm on the mask 10. The laser beam exiting from the expander 203 is directed via a reflection mirror $M_3$ into a prism 204. Interference fringe of equal thickness appeared on the prism surface and the mask surface is imaged on the tube of a TV camera 206 through an imaging or focusing lens 205. Reference numerals $M_4$ and $M_5$ are also reflection mirrors. An electrostatic capacity sensor 207 is provided next to the prism 204 to detect the absolute value of the height corresponding to a point on partial conductive thin film formed in the periphery of the mask 10.

Figure 12:
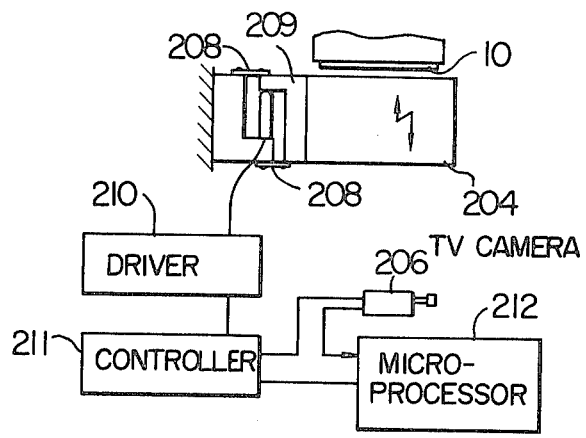
FIG. 12 is a schematic arrangement of the device of FIG. 11.

The prism 204 is supported by a spring set or leaf springs 208 to allow an fine up/down displacement. More particularly, the prism can be finely moved upward or downward by a piezo-electric element 209 having a maximum stroke of 25 μm, as shown in FIG. 12.

FIG. 11 shows the basic principle of how the interference fringe of equal thickness are developed or generated. The deformation amounts on the mask surface appear in the form of contour lines in the interference bands, since the parallel laser rays in phase are interfered with their components reflected at the prism surface and their components reflected at the mask surface. The difference of distance between surfaces of the prism and the mask corresponding to positions at which contour lines in the interference bands exist is determined by the angle of incidence when the laser rays enter into the mask surface and the wavelength of the laser beam. The distance can vary from about 0.3 μm to infinity (∞) in accordance with the change of the angle of incidence but is preferably 2 μm. In FIG. 12, a fine displacement or movement of the prism 204 upward or downward will cause a movement of the interference bands. Therefore, the prism 204 is mvoed stepwise every 0.125 μm through a driver 210 which is actuated by a command from a controller 211, and the interference band image is entered into the TV camera 206. At the same time, the position of the prism and the position of the interference band are stored in a memory in a microprocessor 212. This procedure is repeated at 16 times by an amount corresponding to the interference band pitch 2 μm. The deformation amounts on the mask 10 can be found by analyzing or calculating the positions of the prism and the positions of the interference band corresponding to 16 times with use of the microprocessor 212. That is to say, in case the surface of the mask projects in the down direction, the interference fringe is moved in the radial direction when the prism 204 is moved upward. In case the surface of the prism is concave, the interference fringe is moved in the direction of the center thereof. Therefore, the projection and the concavity of the mask can be distinguished by analyzing the movement direction of the interference fringe by the microprocessor. Moreover, when the prism 204 is moved by 0.125 μm, the difference between the height of the mask surface corresponding to position at which an interference fringe exist before the movement of the prism and that after the movement of the prism corresponds to 0.125 μm. Accordingly, the deformation of the mask can be measured with the precision of 0.125 μm. The fundamental concept is known and is carried out in such a manner as disclosed in the SPIE, Vol. 135, pages 104 to 110, entitled "The Interferometric Analysis of Flatness by Eye and Computer".

On the other hand, the mask deformation amounts obtained from the prism are relative differences but the absolute height values corresponding to the deformation amounts are unknown.

For this purpose of determining the absolute heights, the electrostatic capacity sensor 207 is used to measure the absolute values $W_{mA}$ of heights of the conductive thin film (for example Au) in the periphery of the mask carrier or base 8 in which the LSI circuit pattern does not exist.

The absolute mask deformation value Wm is expressed as the following equation.

$$Wm = F(x, y) + \Delta \tag{1}$$

Where, $\Delta$ is a constant necessary for a relative value $F(x, y)$. The absolute value $F(x_o, y_o)$ at a point $(x_o, y_o)$ measured by the sensor 207 is known with use of the prism, $\Delta$ satisfies the following equation (2).

$$\Delta = W_{mA} - F(x_o, y_o) \tag{2}$$

In this way, the absolute deformation amount Wm on the entire mask 10 can be obtained from equation (1).

Figure 13:
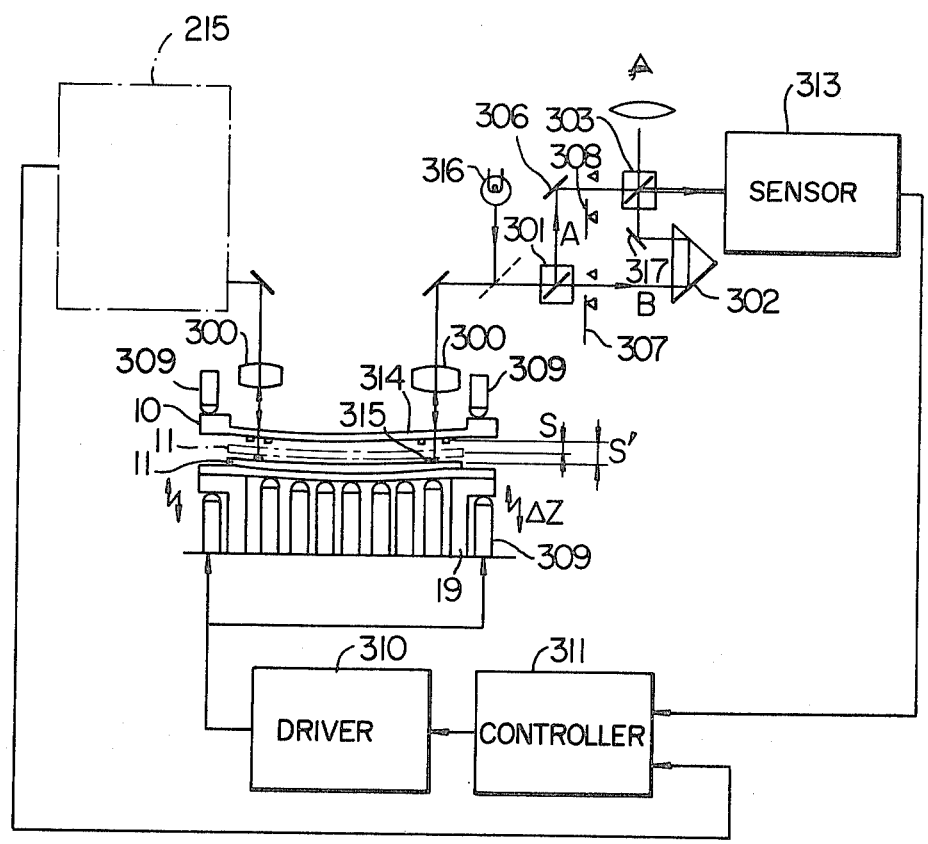
FIG. 13 is a detailed arrangement of an alignment scope used to measure a gap between the mask and wafer at a alignment target mark position.

Although there has been explained in the foregoing a system wherein the absolute values of heights of the mask 10 are meaasured by the sensor 207 shown in FIG. 11 and the absolute values of gaps between the wafer 11 and the mask 10 are adjusted to their desired levels, an alternative system may be used. That is, the deformation amounts of the mask 10 and wafer 11 are detected by the mask-height and wafer-height measuring devices 17 and 21 based on light interference bands, and subsequently the wafer 11 is deformed by means of the water deforming chuck 19 so that the wafer conforms in shape to the mask 10. In this way, the wafer 11 has been deformed so as to conform to the mask 10 in shape. And by aligning alignment marks 314 of the wafer 11 with alignment marks 315 of the mask 10 with use of the optical double-focus alignment system of FIG. 13, the gap between the mask 10 and wafer 11 can be adjusted to a predetermined value S.

More specifically, the mask alignment marks 314 information is sent via an optical path A on the mask side (including an object lens 300, a beam splitter 301, a rectangular prism 302 and a beam splitter 303) to a linear image sensor 313 where the marks 314 in the information are detected. By tilting the entire mask 10 with use of a piezoelectric element 308, the marks 314 are focused on the sensor 313.

On the other hand, a shorter light path B on the wafer side (including an object lens 300, a beam splitter 301, a mirror 306 and a beam splitter 303) is provided so that when the wafer alignment mark 315 is spaced a spacing S of about 10 μm from the mask alignment mark 314, the wafer mark 315 becomes focused on the linear image sensor 313. Therefore, the entire deforming chuck 22 is pre-adjusted so that the gap S' between the wafer 11 and mask 10 (at the mark 314 and 315 positions) is larger than the gap S. Next, the piezoelectric element 309 for wafer tilting is moved gradually upward by a piezoelectric-element driver 310. Under this condition, a controller 311 detects the maximum of the output signal supplied from the linear sensor 313. The entire deforming chuck 19 is positioned at the focused position detected by the controller. This results in that gap between the mask 10 and wafer 11 at the mark 314 and 315 positions becomes the predetermined value S. As a result, there can be corrected a very small tilt in the wafer 11 which occurs when the wafer 11 is transferred from the wafer-height measuring device to the X ray exposure position by moving the wafer movement stage 25 mounted at its top with the wafer. In order to detect the alignment marks 314 and 315, optical shutters 307 and 308 may be provided, if desired.

According to the present invention, as has been disclosed in the foregoing, the gap between the pattern transfer mask and wafer can be made always constant or uniform with accuracy within ±1 micron even if the mask is deformed, waved or curved, by deforming the wafer so as to conform to the shape of the mask. As a result, the offset and out-of-focus (defocused) amounts b, c of the transfer pattern can be kept constant. For example, a submicron (below 1 micron) pattern can be accurately transferred onto the wafer with use of X rays. In addition, in photolithographic process, it is possible to transfer a fine pattern at its optical resolution limit, which leads to a remarkable improvement in the yield of such integrated circuit chips as LSI.

The mask-height measuring device 16 and the movement stage 25 have been supported slidably on the same straight guide rail 18 in the above embodiments, it will be appreciated that the device and stage are carried preferably on different straight guide rails respectively because the wafer chuck 22 must be provided with a mechanism which supplies and discharges the wafer 10 in the practical applications. That is, it is desirable to support the mask-height measuring device 16 slidably on another straight guide rail which extends in a direction perpendicular to the paper plane of FIG. 4.

We claim:

1. In an exposure process for transferring a mask pattern onto a wafer, the steps of measuring heights on the mask surface at many points by a mask-height measuring device and measuring heights on the wafer surface at many points by a wafer-height measuring device, deforming the wafer by means of a chuck which sucks and holds the wafer at many points thereon and finely moves the wafer at said many points upwardly or downwardly individually and independently according to said measured results, and adjusting a gap between the mask and the wafer to a predetermined value for enabling proper transfer of the mask pattern onto the wafer during the exposure process.

2. An exposure process as set forth in claim 1, wherein X-rays are used in said exposure process.

3. An exposure process as set forth in claim 1, wherein the step of adjusting the gap between the mask and the wafer to a predetermined value includes adjusting the gap so that the gap between the mask and the wafer at the many points of the wafer is substantially uniform.

4. In an exposure system for transferring onto a wafer a circuit pattern formed on a mask, a chuck provided with means for sucking and holding the wafer at many points thereon and for finely moving the wafer at said many points upwardly or downwardly individually and independently; a stage provided with said chuck and supported slidably on a platen between an exposure position and a wafer-height measuring position; a wafer-height measuring device disposed in opposition to the wafer when said wafer is moved to said wafer-height measuring position by said stage for measuring heights on the wafer at said many points; and a mask-height measuring device slidably supported on said platen between said exposure position and a standby position and disposed in opposition to the mask at the exposure position, for measuring heights on the mask surface at many points; means for detecting a gap between the wafer and the mask according to said wafer heights measured by said wafer-height measuring device and said mask heights measured by said mask-height measuring device, and said fine up/down moving means being actuated to deform the wafer so that said detected gap becomes a predetermined value whereby proper transfer of the circuit pattern in the mask onto the wafer is enabled during exposure.

5. An exposure system as set forth in claim 4, wherein said fine up/down moving means are actuated so that said detected gap between the wafer and the mask at the many points of the wafer is substantially uniform.

6. An exposure system as set forth in claim 4, further comprising an X ray exposure type system including an X ray source and means for preventing the attenuation of X rays emitted from said X ray source and for radiating the X rays on the mask.

7. An exposure system as set forth in claim 6, wherein said mask-height measuring device includes an optical mask-height measuring means.

8. An exposure system as set forth in claim 7, wherein said optical mask-height measuring means measures said mask heights on a light interference band basis.

9. An exposure system as set forth in claim 8, wherein said mask-height measuring device includes a sensor for detecting the absolute values of positions on the mask and in the periphery thereof.

10. An exposure system as set forth in claim 8, further including an observation or detection optical system provided within a chamber for observing or imaging an alignment mark on the mask and an alignment mark on the wafer and for detecting a gap between the mask and wafer at said alignment mark positions respectively on the mask and wafer, and means for finely moving said entire chuck upwardly or downwardly in such a manner that said gap detected by said optical system becomes a predetermined value.

11. An exposure system as set forth in claim 10 wherein said observation or detection optical system includes a double focus optical system with different light paths.

* * * * *